US006537688B2

(12) United States Patent
Silvernail et al.

(10) Patent No.: US 6,537,688 B2
(45) Date of Patent: Mar. 25, 2003

(54) ADHESIVE SEALED ORGANIC OPTOELECTRONIC STRUCTURES

(75) Inventors: Jeffrey Alan Silvernail, Yardley, PA (US); Michael Stuart Weaver, Princeton, NJ (US); Mark A. Rothman, Skillman, NJ (US)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 09/727,995

(22) Filed: Dec. 1, 2000

(65) Prior Publication Data

US 2002/0068143 A1 Jun. 6, 2002

(51) Int. Cl.$^7$ ............................. B32B 3/00; H05B 33/04
(52) U.S. Cl. ........................ 428/690; 428/76; 428/917; 313/504; 313/506; 313/512; 257/99; 257/100; 359/265; 136/251; 136/259
(58) Field of Search ................................ 428/690, 917, 428/76; 313/512, 506, 504; 257/100, 99; 359/265; 136/257, 259

(56) References Cited

U.S. PATENT DOCUMENTS

| | | | |
|---|---|---|---|
| 4,357,557 A | | 11/1982 | Inohara et al. ............... 313/509 |
| 4,640,583 A | * | 2/1987 | Hoshikawa et al. ......... 350/343 |
| 5,051,654 A | | 9/1991 | Nativi et al. ................. 313/506 |
| 5,072,263 A | * | 12/1991 | Watanabe et al. ............. 357/17 |
| 5,707,745 A | | 1/1998 | Forrest et al. ............... 428/432 |
| 5,757,126 A | | 5/1998 | Harvey, III et al. ........ 313/506 |
| 5,771,562 A | | 6/1998 | Harvey, III et al. ........ 29/592.1 |
| 5,882,761 A | | 3/1999 | Kawami et al. ............... 428/69 |
| 5,952,778 A | | 9/1999 | Haskal et al. ............... 313/504 |
| 5,962,962 A | | 10/1999 | Fujita et al. ................. 313/412 |
| 6,011,607 A | * | 1/2000 | Yamazaki et al. ........... 349/153 |
| 6,081,071 A | * | 6/2000 | Rogers ......................... 313/512 |
| 6,083,313 A | | 7/2000 | Venkatraman et al. . 106/287.14 |
| 6,146,225 A | | 11/2000 | Sheats et al. ................. 445/24 |
| 6,198,217 B1 | * | 3/2001 | Suzuki et al. ............... 313/504 |

FOREIGN PATENT DOCUMENTS

| | | | | |
|---|---|---|---|---|
| EP | 0 977 469 A2 | 2/2000 | ........... | H05B/33/04 |
| JP | 03194894 | * 8/1991 | | |
| JP | 07169569 | 7/1995 | ........... | H05B/33/04 |
| JP | 09153395 | 6/1997 | ........... | H05B/33/22 |
| JP | 2000036384 | * 2/2000 | | |
| JP | 2000223262 | * 8/2000 | | |
| WO | WO 99/02277 | 1/1999 | ........... | B05D/5/12 |
| WO | WO 99/39393 | 8/1999 | ........... | H01L/51/20 |
| WO | WO 00/08899 | * 2/2000 | | |
| WO | WO 00/26973 | 5/2000 | ........... | H01L/51/20 |
| WO | WO 00/36665 | 6/2000 | ........... | H01L/51/20 |
| WO | WO 00/65879 | 11/2000 | ........... | H05B/00/12 |

* cited by examiner

Primary Examiner—Cynthia H. Kelly
Assistant Examiner—Dawn Garrett
(74) Attorney, Agent, or Firm—Mayer Fortkort & Williams, PC; David B. Bonham, Esq.

(57) ABSTRACT

An organic optoelectronic device structure is provided. The organic optoelectronic device structure comprises: (a) a polymer substrate layer; (a) a first barrier region disposed over a first face of the polymer substrate layer; (c) an organic optoelectronic device disposed over a second face of the polymer substrate layer opposite the first face; (d) a second barrier region disposed over the second face of the polymer substrate layer and over the organic optoelectronic device; and (e) an adhesive region. The adhesive region is disposed between the polymer substrate layer and the second barrier region such that it bonds the polymer substrate layer to the second barrier region. Moreover, the adhesive region encircles the organic optoelectronic device such that the organic optoelectronic device is completely surrounded by the adhesive region, the polymer substrate layer and second barrier region. In some embodiments, the organic optoelectronic device structure is further provided with a third barrier region, which is disposed at least on the edges of the polymer substrate layer. Organic optoelectronic devices, including circuits, appropriate for the practice of the present invention include organic light emitting devices, organic electrochromic displays, organic photovoltaic devices and organic thin film transistors.

42 Claims, 3 Drawing Sheets

ADHESIVE SEALED ORGANIC OPTOELECTRONIC STRUCTURES

FIELD OF THE INVENTION

The present invention relates to structures that protect organic optoelectronic devices from the surrounding environment.

BACKGROUND OF THE INVENTION

Organic optoelectronic devices, including circuits, such as organic light emitting diodes, organic electrochromic displays, organic photovoltaic devices and organic thin film transistors, are known in the art and are becoming increasingly important from an economic standpoint.

As a specific example, organic light emitting devices ("OLEDs"), including both polymer and small-molecule OLEDs, are potential candidates for a great variety of virtual- and direct-view type displays, such as lap-top computers, televisions, digital watches, telephones, pagers, cellular telephones, calculators and the like. Unlike inorganic semiconductor light emitting devices, organic light emitting devices are generally simple and relatively easy and inexpensive to fabricate. Also, OLEDs readily lend themselves to applications requiring a wide variety of colors and to applications that concern large-area devices. In general, two-dimensional OLED arrays for imaging applications are known in the art and are typically composed of a plurality of OLEDs (one or more of which forms a pixel) arranged in rows and columns. Each individual OLED in the array is typically constructed with a first transparent anode (such as ITO), an organic electroluminescent layer on the first electrode, and a metallic cathode on the organic electroluminescent medium. Other OLED architectures are also known in the art such as transparent OLEDs (transparent cathode contact), and inverted OLEDs.

In forming an OLED, a layer of reactive metal is typically utilized as the cathode to ensure efficient electron injection and low operating voltages. However, reactive metals and their interface with the organic material are susceptible to oxygen and moisture, especially during operation, which can severely limit the lifetime of the devices. Moreover, moisture and oxygen are also known to increase "dark spot areas" in connection with OLEDs. Components of various other organic optoelectronic devices (e.g., organic electrochromic displays, organic photovoltaic devices and organic thin film transistors) are likewise susceptible to attack from exterior environmental species, including water and oxygen.

SUMMARY OF THE INVENTION

The above and other challenges are addressed by the present invention. According to an embodiment of the invention, an organic optoelectronic device structure is provided. The organic optoelectronic device structure comprises: (a) a polymer substrate layer; (b) a first barrier region disposed over a first face of the polymer substrate layer; (c) an organic optoelectronic device, selected from as organic light emitting diode, an organic electrochromic display, an organic photovoltaic device and an organic thin film transistor, disposed over a second face of the polymer substrate layer opposite the first face; (d) a second barrier region disposed over the second face of the polymer substrate layer and over the organic optoelectronic device; and (e) an adhesive region. The adhesive region is disposed between the polymer substrate layer and the second barrier region such that it bonds the polymer substrate layer to the second barrier region. Moreover, the adhesive region encircles the organic optoelectronic device such that the organic optoelectronic device is completely surrounded by the adhesive region, the polymer substrate layer and second barrier region.

The polymer substrate layer preferably ranges from 75 to 625 microns in thickness and is preferably a fluorocarbon polymer, a polyethersulphone, a polyimide, a polyester, such as polyethylene terephthalate, or a material such as polymethylmethacrylate (PMMA).

The first barrier region preferably comprises at least one planarizing layer and at least one high-density layer, more preferably an alternating series of at least two planarizing layers and at least two high-density layers, and most preferably an alternating series of 3 to 7 planarizing layers and 3 to 7 high-density layers. Fluorinated polymers, parylenes, and polyacrylates are preferred materials for the planarizing layers, while metal oxides, metal nitrides, metal carbides, metal oxynitrides, or combinations, may be used for the high-density layers. Silicon oxide, silicon nitride, aluminum oxide, indium tin oxide and zinc indium tin oxide are preferred materials for the high-density layers.

In some instances, the second barrier region comprises a metal layer, such as a metal foil. In others, the second barrier layer comprises (a) a polymer layer adjacent the adhesive region and (b) an alternating series of at least two planarizing layers and at least two high-density layers over the polymer layer.

A gettering material is preferably provided in connection with the organic optoelectronic device structure and is situated such that it, along with the organic optoelectronic device, is surrounded by the adhesive region, the polymer substrate layer and second barrier region.

The adhesive region preferably comprises an ultraviolet-curable adhesive material or a thermally curable adhesive material, more preferably an ultraviolet- or thermally-curable epoxy material.

In some embodiments, the organic optoelectronic device structure is further provided with a third barrier region that covers at least the edges of the polymer substrate layer. In other embodiments, the third barrier region covers at least the edges of the organic optoelectronic device structure, and in still other embodiments, the third barrier region encapsulates the entire organic optoelectronic device structure. The third barrier region preferably comprises an epoxy material, which can be provided, for example, via a dipping process. The third barrier region is also preferably provided with a gettering agent, such as calcium oxide.

Preferred organic optoelectronic devices for the practice of the present invention include organic light emitting devices, organic electrochromic displays, organic photovoltaic devices and organic thin film transistors. Most preferably the organic optoelectronic devices are organic light emitting devices, which comprise an anode, a cathode and an organic emissive layer.

One advantage of the present invention is that an organic optoelectronic structure is produced that provides an effective barrier between the organic optoelectronic device and the ambient atmosphere, reducing adverse effects due to chemical species in the ambient atmosphere, such as moisture and oxygen.

Another advantage of the present invention is that an organic optoelectronic structure is provided that maintains good adhesion between its various layers.

These and other embodiments and advantages of the present invention will become readily apparent to those of ordinary skill in the art upon review of the disclosure to follow.

As is commonly the case with such figures, the above are simplified schematic representations and the actual structures will differ in numerous respects including the relative scale of the components.

DETAILED DESCRIPTION OF THE INVENTION

The present invention now will be described more fully hereinafter with reference to the accompanying drawings, in which preferred embodiments of the invention are shown. This invention may, however, be embodied in different forms and should not be construed as limited to the embodiments set forth herein.

As used herein, a "layer" of a given material includes a region of that material whose thickness is small compared to both its length and width. Examples of layers include sheets, foils, films, laminations, coatings, and so forth. As used herein a layer need not be planar, but can be bent, folded or otherwise contoured, for example, to at least partially envelop another component.

Figure 1:
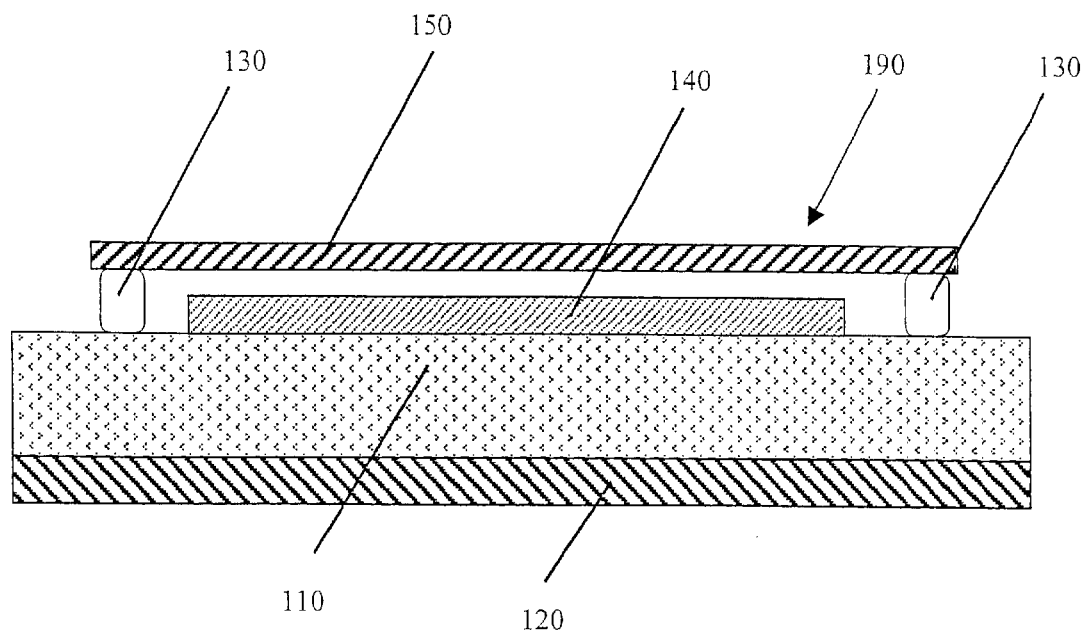
FIG. 1 is a cross-sectional view of an OLED structure, according to an embodiment of the invention.

Referring now to FIG. 1, an OLED structure 190 is shown in accordance with an embodiment of the invention. The OLED structure 190 includes an OLED 140 situated on polymer substrate layer 110. A first barrier region 120 (which can comprise, for example, one or more barrier layers) is provided on the face of the polymer substrate layer 110 that is opposite the face upon which the OLED 140 is disposed. Over the OLED is a second;barrier region 150, which, like the first barrier region 120, can also comprise, for example, one or more barrier layers. The second barrier region 150 may or may not contact the OLED 140. An adhesive region 130 is disposed between the polymer substrate layer 110 and the second barrier region 150, bonding the polymer substrate layer 110 to the second barrier region 150.

Although not necessarily immediately apparent from the two-dimensional rendering of FIG. 1, the adhesive region 130 encircles the OLED 140, and has an appearance somewhat like that of a gasket occupying the space between polymer substrate layer 110 and the second barrier region 150. As a result, in the embodiment shown, adhesive region 130 cooperates with the polymer substrate layer 110 and the second barrier region 150 to isolate the OLED from the outside environment.

The OLED structure can be any OLED known in the art. For example, as noted above, the OLED will typically comprise an anode layer (typically transparent), a cathode layer, and a light-emitting layer disposed between the anode and cathode layer. The light emitting layer (or emission layer) can be provided in connection with a number of configurations, including the following: (a) a three-layer configuration comprising a hole transporting layer, an emission layer and an electron transporting layer (i.e., a double heterostructure configuration), (b) a two-layer configuration comprising a hole transporting layer and a layer that provides both emission and electron transporting functions (i.e., a single heterostructure configuration) and (c) a configuration comprising a single layer that provides hole transporting, electron transporting and emission functions (i.e., a single layer configuration). In each configuration, additional layers may also be present, for example, layers that enhance hole injection or electron injection, or layers that serve to block holes or electrons. Several structures for such devices are discussed, for example, in U.S. Pat. No. 5,707,745, the entire disclosure of which is hereby incorporated by reference. Other more complex OLED architecture is also practiced in the art.

Although an OLED 140 is shown in connection with the various figures, other organic optoelectronic devices, such as organic electrochromic displays, organic photovoltaic devices and organic thin film transistors, can be used in place of the OLED 140 that is shown.

In the present invention, the polymer substrate layer 110 is selected to provide good bonding properties, such that a strong bond is formed between the adhesive region 130 and the polymer substrate layer 110. In many embodiments, the polymer substrate layer 110 is also selected to provide good optical characteristics and/or to provide flexibility and conformability to other surfaces. Preferred polymer substrate layer 110 materials include polyesters, polyethersulphones, polyimides and fluorocarbons that are capable of providing a strong adhesive bond. Preferred polyesters include polyethylene terephthalate. Preferred fluorocarbon polymers include Aclar® fluoropolymer available from Honeywell. The polymer substrate layer 110 typically ranges from 75 to 625 microns in thickness.

As with the polymer substrate layer 110, the first barrier region 120 is also typically selected to provide good optical characteristics. Moreover, in its role as a barrier, the first barrier region 120 also acts to block the transport of oxygen, water and any other detrimental molecules from the outside environment.

Preferred barrier regions 120 for the practice of the present invention include both layers of high-density material and layers of planarizing material. These layers are preferably provided in an alternating configuration. Preferably, 1 to 10 pairs of these layers, more preferably 3 to 7 pairs, are used. By "planarizing material" is meant a material that forms a smooth planar surface upon application, rather than forming a surface that reflects irregular contours of the underlying surface. Preferred planarizing materials include polymers, such as fluorinated polymers, parylenes, cyclotenes and polyacrylates. Layers of such planarizing materials can be provided using techniques known in the art, for example, by dipping, spin coating, sputtering, evaporative coating, spraying, flash evaporation, chemical vapor deposition and so forth.

By "high-density material" is meant a material with sufficiently close atomic spacing such that diffusion of outside species, particularly water and oxygen, are hindered. Preferred high-density materials include inorganic materials such as silicon oxides (SiOx), including silicon monoxide (SiO) and silicon dioxide ($SiO_2$), silicon nitrides (typically $Si_3N_4$), aluminum oxides (typically $Al_2O_3$), indium-tin oxides (ITO) and zinc indium tin oxides. Layers of high-density material can be applied using techniques known in the art such as thermal evaporation, sputtering, PECVD methods and electron-beam techniques.

Examples of multilayer barrier regions comprising layers of both high-density material and layers of planarizing material are disclosed, for example, in U.S. Pat. No. 5,757,126, the entire disclosure of which is hereby incorporated by reference. Typically, these multilayer barrier regions are provided between the polymer substrate layer and the OLED, because lateral diffusion is substantial due to the large thickness (and hence large lateral area) associated with the substrate. Moreover, additional difficulties arise due to release of chemical species from the substrate. Unfortunately, this arrangement is unsuitable for many applications, including those where a second barrier region opposite the OLED (for instance, a barrier region in the form of a metal can or other hermetic layer) is bonded to the multilayer barrier region. In particular, attachment of the second barrier region opposite the OLED (metal can, etc.) can ultimately result in a substantial amount of stress being exerted upon the interface between the polymer substrate layer and the multilayer barrier region. Unfortunately, the bond between the polymer substrate layer and the multilayer barrier region is relatively weak. As a result, the resulting structure is not particularly robust, with separation of the multilayer barrier region from the polymer substrate layer being a constant threat. In addition, this configuration is believed to result in a decrease in barrier effectiveness during anode processing.

Depending on the application, the second barrier region 150 opposite the OLED from the polymer substrate layer 110 may or may not need to be optically transparent. Typical materials for the second barrier region include polymers and metals. Metals are frequently preferred due to their excellent barrier properties, and can be provided in a number of configurations such as in the form of a metal can and or metal foil, with metal foils being preferred due to ease of manufacture. Preferred metals include aluminum, gold and indium, as well as other foils known in the art.

Figure 2:
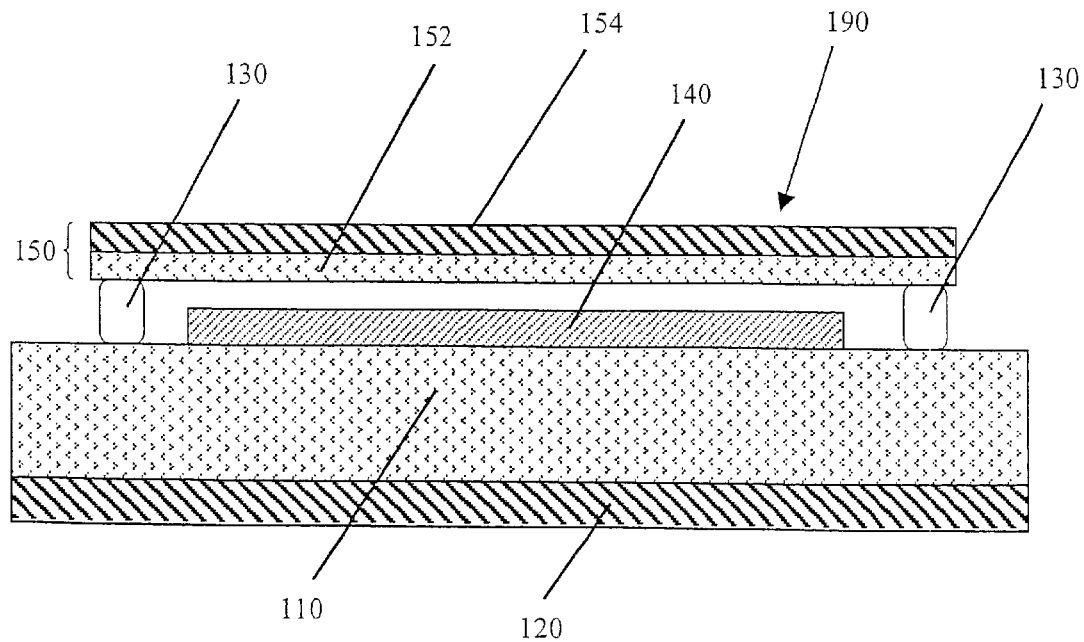
FIG. 2 is a cross-sectional view: of another OLED structure, according to an embodiment of the invention.

Polymers are often preferred where optical transparency is desired or where ease of continuous manufacture (e.g., roll-to-roll manufacture) is desired. Where polymers are used, the second barrier region 150 preferably includes additional barrier protection such that it includes both a polymer cap layer 152 and a barrier region 154 (see FIG. 2). The barrier region 154 is preferably an alternating series of high-density layers and planarizing layers as discussed above in connection with the first barrier layer 120. Materials appropriate for the polymer cap layer 152 include those discussed above in connection with the polymer substrate layer 110. As above, the polymer cap layer 152, rather than the transparent barrier region 154, is provided adjacent the adhesive region 130 due to the interfacial bonding difficulties previously noted.

The adhesive region 130 is selected to provide a good bond between the polymer substrate layer 110 and the second barrier region 150 and to provide a barrier to moisture and oxygen, without damaging the OLED during curing (e.g., due to off-gassing). Preferred materials for these purposes include ultraviolet-curable and thermally curable epoxy materials. Preferred epoxy materials are thermally curable, single-part epoxies such as Epotek OG159. The thickness of the adhesive region typically ranges from 25 to 100 microns.

In some embodiments of the invention, a gettering material (not shown) is placed adjacent the OLED 140, such that the gettering material, along with the OLED, are surrounded by the polymer substrate layer 110, second barrier region 150 and adhesive region 130. The gettering material acts to capture any moisture, oxygen, etc. that may reach the interior of the device 190 and harm the OLED 140. Preferred gettering materials include CaO and BaO. One particularly preferred product is HICAP2000, a CaO paste obtainable from Cookson SPM.

Figure 3:
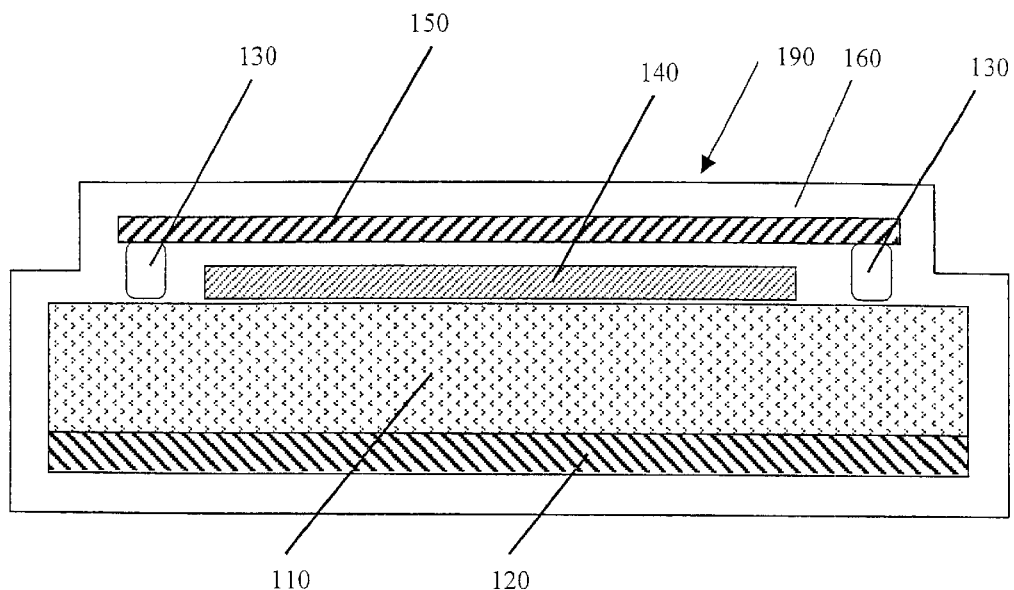
FIG. 3 is a cross-sectional view of the OLED structure of FIG. 1, upon being provided with an encapsulating barrier layer.
Figure 4:
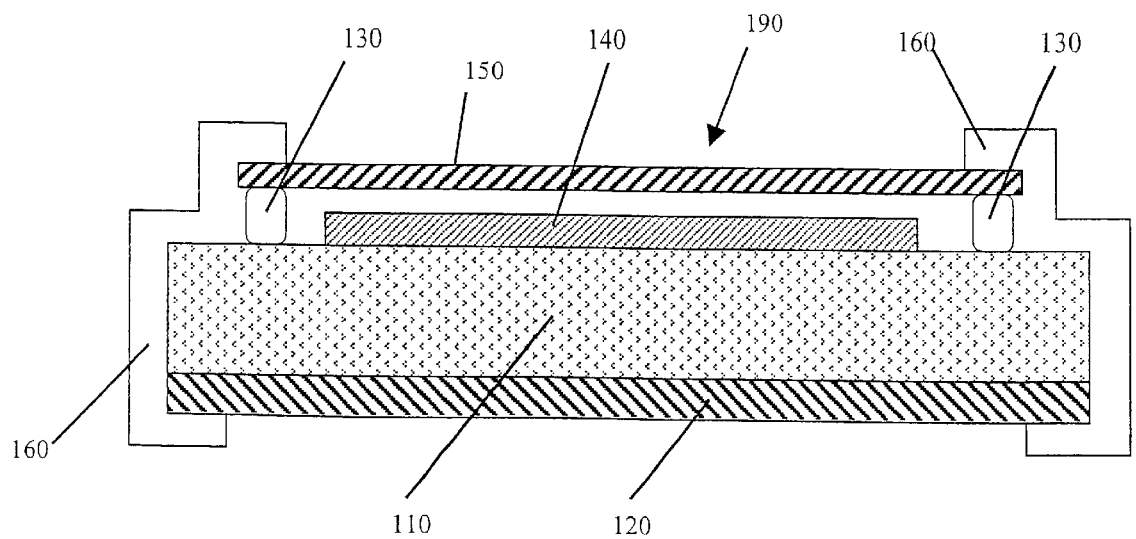
FIG. 4 is a cross-sectional view of the OLED structure of FIG. 1, upon being provided with an edge barrier layer.

Turning now to FIG. 3, in accordance with another embodiment of the invention, an OLED structure 190 is provided in which the entire structure is surrounded by an encapsulating region 160, which acts as a third barrier region. (The remainder of the OLED structure of FIG. 3 is like that shown in FIG. 1, but other configurations are clearly possible.) In FIG. 4, in accordance with another embodiment of the invention, an OLED structure 190 is provided in which the edges of the entire structure are surrounded by the encapsulating region 160, which act as an edge barrier. In accordance with another embodiment of the invention (not shown), the edges of the polymer substrate layer are provided with an edge barrier prior to incorporation of the substrate into the device structure.

The preferred materials for the encapsulating region 160 in both FIGS. 3 and 4 are epoxies. More preferred are ultraviolet-curable epoxy materials having viscosities that are sufficiently low to flow smoothly and form an optically clear surface. Preferably, the refractive index of the encapsulation region 160 is as precisely matched to the refractive index of the substrate 110 as is possible.

Figure 5:
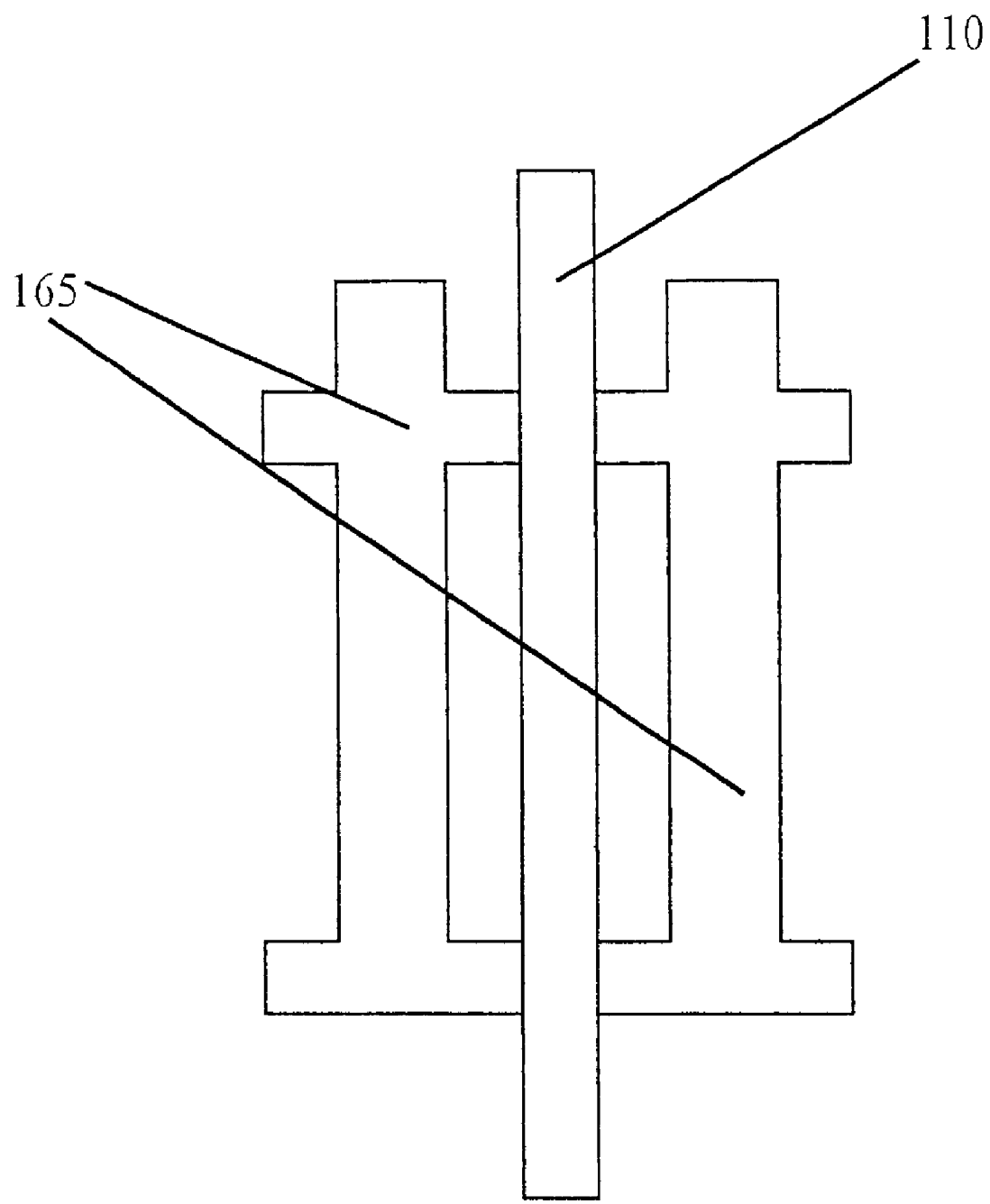
FIG. 5 is a schematic diagram of a substrate being held by a rotatable chuck.

Preferred techniques for applying the encapsulating region 160 include dipping, pouring and spin coating.

Where only the edge of the substrate 110 (or the edge of the entire OLED structure) is to be provided with the encapsulating region 160, the substrate 110 (or OLED structure) can be held within a rotatable chuck 165 as shown in FIG. 5. The substrate 110, rather than the OLED structure, is illustrated in FIG. 5. As the chuck 165 is rotated, the substrate 110 (or OLED structure) is dipped into a suitable material in liquid form (for example, the above epoxies, or liquid polyimide or fluorocarbon formulations), after which the material in liquid form is cured. Other alternatives are also possible such as spraying with a suitable material while rotating the chuck.

In other embodiments, the substrate or OLED structure (along with any chuck or other holder) is inserted into a vacuum chamber, whereupon a high-density material (such as those discussed above) or other appropriate material is applied, for example, by sputtering, by electron-beam techniques, or by any other known techniques for depositing a layer under vacuum.

As noted above, multilayer barrier regions, such as those of U.S. Pat. No. 5,757,126, are typically provided between the polymer substrate layer and the OLED, because lateral diffusion of chemical species from the outside environment, including oxygen and moisture, is substantial due to the large thickness (and hence large edge area) associated with the substrate. The encapsulating region 160 provides an additional barrier against these species. The barrier properties of the encapsulating region 160 can be improved by adding a gettering agent to the encapsulating region 160. Preferred gettering agents appropriate for this aspect of the invention are those materials that are compatible with epoxy and include CaO.

As also noted above, arrangement of the multilayer barrier regions between the polymer substrate layer and the OLED can cause additional difficulties due to release of chemical species from the substrate. Hence, the substrates used in connection with the practice of the present invention are preferably degassed by heating under vacuum prior to use.

Although the present invention has been described with respect to several exemplary embodiments, there are many other variations of the above-described embodiments that will be apparent to those of ordinary skill in the art. It is understood that these variations are within the teachings of the present invention, and that the invention is to be limited only by the claims appended hereto.

What is claimed is:

1. An organic optoelectronic device structure comprising:
   a polymer substrate layer;
   a first barrier region disposed over a first face of said polymer substrate layer;
   an organic optoelectronic device selected from an organic light emitting diode, an organic electrochromic display, an organic photovoltaic device and an organic thin film transistor, disposed over a second face of said polymer substrate layer opposite said first face;
   a second barrier region disposed over said second face of said polymer substrate layer and over said organic optoelectronic device; and
   an adhesive region, wherein said adhesive region is disposed between said polymer substrate layer and said second barrier region such that it bonds said polymer substrate layer to said second barrier region, and wherein said organic optoelectronic device is completely surrounded by the combination of said adhesive region, said polymer substrate layer and second barrier region.

2. The organic optoelectronic device structure of claim 1, wherein said first barrier region comprises at least one planarizing layer and at least one high-density material layer.

3. The organic optoelectronic device structure of claim 2, wherein said first barrier region comprises an alternating series of at least two planarizing layers and at least two high-density material layers.

4. The organic optoelectronic device structure of claim 1, wherein said second barrier region comprises a metal layer.

5. The organic optoelectronic device structure of claim 1, wherein said second barrier region comprises a polymer layer and an alternating series of at least two planarizing layers and at least two high-density material layers, and wherein said polymer layer is disposed adjacent said adhesive region.

6. The organic optoelectronic device structure of claim 1, wherein a gettering material is provided, and wherein said gettering material, along with said organic optoelectronic device, is surrounded by said adhesive region, said polymer substrate layer and second barrier region.

7. The organic optoelectronic device structure of claim 1, wherein said adhesive region comprises an adhesive material selected from an ultraviolet-curable material and a thermally curable material.

8. The organic optoelectronic device structure of claim 7, wherein said adhesive material is an epoxy material.

9. The organic optoelectronic device structure of claim 1, further comprising a third barrier region, said third barrier region covering at least edges of said polymer substrate layer.

10. The organic optoelectronic device structure of claim 9, wherein said third barrier region comprises an epoxy material.

11. The organic optoelectronic device structure of claim 9, wherein the third barrier region covers at least edges of said organic optoelectronic device structure.

12. The organic optoelectronic device structure of claim 11, wherein said third barrier region comprises an epoxy material.

13. The organic optoelectronic device structure of claim 9, wherein the third barrier region encapsulates the entire organic optoelectronic device structure.

14. The organic optoelectronic device structure of claim 13, wherein said third barrier region comprises an epoxy material.

15. The organic optoelectronic device structure of claim 10, wherein said epoxy further comprises a gettering agent.

16. An OLED structure comprising:
    a polymer substrate layer;
    a first barrier region disposed over a first face of said polymer substrate layer;
    an OLED comprising an anode, a cathode and an organic emissive layer, said OLED disposed over a second face of said polymer substrate layer opposite said first face;
    a second barrier region disposed over said second face of said polymer substrate layer and over said OLED; and
    an adhesive region, wherein said adhesive region is disposed between said polymer substrate layer and said second barrier region such that it bonds said polymer substrate layer to said second barrier region, and wherein said OLED is completely surrounded by the combination of said adhesive region, said polymer substrate layer and second barrier region.

17. The OLED structure of claim 16, wherein said polymer substrate layer is selected from a fluorocarbon polymer, a polyethersulphone and a polyimide.

18. The OLED structure of claim 16, wherein said polymer substrate layer is a polyester.

19. The OLED structure of claim 18, wherein said polyester is polyethylene terephthalate.

20. The OLED structure of claim 16, wherein said polymer substrate layer ranges from 75 to 625 microns in thickness.

21. The OLED structure of claim 16, wherein said first barrier region comprises at least one planarizing layer and at least one high-density material layer.

22. The OLED structure of claim 21, wherein said first barrier region comprises an alternating series of at least two planarizing layers and at last two high-density material layers.

23. The OLED structure of claim 22, wherein said alternating series comprises 3 to 7 planarizing layers and 3 to 7 high-density material layers.

24. The OLED structure of claim 21, wherein said planarizing layer comprises a material selected from fluorinated polymers, parylenes, cyclotenes and polyacrylates.

25. The OLED structure of claim 21, wherein said high-density material layer material comprises a metal oxide, a metal nitride, a metal carbide, or a metal oxynitride.

26. The OLED structure of claim 21, wherein said high-density material layer comprises a material selected from silicon oxide, silicon nitride, aluminum oxide, indium tin oxide and zinc indium tin oxide.

27. The OLED structure of claim 16, wherein said second barrier region comprises a metal layer.

28. The OLED structure of claim 27, wherein said second barrier region consists of a metal foil.

29. The OLED structure of claim 16, wherein said second barrier region comprises a polymer layer and an alternating series of at least two planarizing layers and at last two high-density material layers, and wherein said polymer layer is disposed adjacent said adhesive region.

30. The OLED structure of claim 16, further comprising a gettering material, wherein said gettering material, along with said OLED, is surrounded by said adhesive region, said polymer substrate layer and second barrier region.

31. The OLED structure of claim 16, wherein said adhesive region comprises an adhesive material selected from an ultraviolet-curable material and a thermally curable material.

32. The OLED structure of claim 16, wherein said adhesive region comprises an epoxy material.

33. The OLED structure of claim 32, wherein said epoxy material is a thermally curable epoxy material.

34. The OLED structure of claim 16, further comprising a third barrier region, said third barrier region covering at least edges of said polymer substrate layer.

35. The OLED structure of claim 34, wherein said third barrier region comprises an epoxy material.

36. The OLED structure of claim 34, wherein the third barrier region covers at least edges of said OLED structure.

37. The OLED structure of claim 36, wherein said third barrier region comprises an epoxy material.

38. The OLED structure of claim 34, wherein the third barrier region encapsulates the entire OLED structure.

39. The OLED structure of claim 38, wherein said third barrier region comprises an epoxy material.

40. The OLED structure of claim 39, wherein said OLED device is encapsulated in said epoxy material by a dipping process.

41. The OLED structure of claim 35, wherein said epoxy further comprises a gettering agent.

42. The OLED structure of claim 41, wherein said gettering agent is calcium oxide.

* * * * *